United States Patent
Goumballa et al.

(10) Patent No.: US 9,509,310 B1
(45) Date of Patent: Nov. 29, 2016

(54) LVDS AND SUBLVDS DRIVER CIRCUIT

(71) Applicant: FREESCALE SEMICONDUCTOR, INC., Austin, TX (US)

(72) Inventors: Birama Goumballa, Larra (FR); Cristian Pavao-Moreira, Frouzins (FR); Didier Salle, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 15/053,673

(22) Filed: Feb. 25, 2016

(51) Int. Cl.
  *H03B 1/00* (2006.01)
  *H03K 3/00* (2006.01)
  *H03K 19/0185* (2006.01)
  *H04B 1/04* (2006.01)

(52) U.S. Cl.
  CPC ........ *H03K 19/018528* (2013.01); *H04B 1/04* (2013.01)

(58) Field of Classification Search
  CPC ................ H03K 19/0175; H03K 19/018514; H03K 19/21; H03K 3/012
  USPC .......... 327/108–112, 427, 434, 437; 326/82, 326/83, 87
  See application file for complete search history.

(56) References Cited

U.S. PATENT DOCUMENTS

| | | | |
|---|---|---|---|
| 6,356,141 B1* | 3/2002 | Yamauchi | G05F 3/262 323/312 |
| 7,183,813 B2* | 2/2007 | Kasanyal | H03K 5/133 327/108 |
| 7,358,780 B2 | 4/2008 | Chou | |
| 7,598,779 B1 | 10/2009 | Wang et al. | |
| 8,358,156 B1* | 1/2013 | Abugharbieh | H03K 19/01755 327/108 |
| 8,421,727 B2* | 4/2013 | Hosokawa | G09G 3/20 326/83 |
| 8,466,982 B2* | 6/2013 | Liu | G05F 1/56 327/108 |
| 9,362,915 B1* | 6/2016 | Phillippe | H03K 19/0175 |
| 2010/0289534 A1* | 11/2010 | Suenaga | H04L 25/028 327/108 |
| 2012/0162189 A1* | 6/2012 | Ebuchi | H03K 19/00361 345/212 |

* cited by examiner

*Primary Examiner* — Lincoln Donovan
*Assistant Examiner* — Thomas Skibinski

(57) ABSTRACT

A driver circuit configured to produce a pair of output signals from a pair of input signals.
The proposed solution brings improvements over conventional LVDS and subLVDS driver circuits because it enables the use of a single driver circuit (also known as "buffer") which is compliant with both LVDS and subLVDS transmission standards. This allows flexibility with MCUs for instance the automotive industry. Further, proposed solution has the advantage of saving die size in comparison to a solution where two buffers would have been used for different transmission standards. Further, high speed transmission rate is maintained since transmission is performed for one standard at the time.
An integrated circuit, a printed circuit and a data processing circuit are also claimed.

20 Claims, 3 Drawing Sheets

LVDS AND SUBLVDS DRIVER CIRCUIT

CROSS REFERENCE TO RELATED APPLICATION(S)

The present application claims priority to International Patent Application No. PCT/IB2015/002296, entitled "LVDS AND SUBLVDS DRIVER CIRCUIT," filed on Sep. 25, 2015, the entirety of which is herein incorporated by reference.

FIELD OF THE INVENTION

This invention relates generally to circuitry. More particularly, it relates to a driver circuit, an integrated circuit, a printed circuit and a data processing circuit for differential data communications.

BACKGROUND OF THE INVENTION

Low voltage differential signaling (LVDS) is a serial link standard designed to accommodate high speed transfer of data which have been implemented for decades in serial data communications in the automotive industry.

Recently, automotive vehicles started to incorporate vision systems that include cameras which capture images of exterior of vehicles. Such vision systems may be used to display captured images for viewing by a driver of a vehicle, but also can be used to detect objects, such as objects to the rear of the vehicle during a reversing maneuver, or such as approaching or following vehicles.

A joint effort within the MIPI Alliance has defined several Camera Serial Interface (CSI) standards such as CSI-1, CSI-2 and CSI-3 which is the latest. See, for example, the Camera Interface Specifications on the MIPI Alliance® website: [http://www.mipi.org/specifications/camera-interface#CSI3]. All MIPI CSI-x standards are meant for high speed transfer of image data over short distances such as across a PCB to a compartment display, compartment projector, head unit or ECU/MCU. In addition to high speed image data transfer, MIPI CSI-x standards are also meant for low power data transfer. In other words, MIPI CSI-x standards support a low power ("LP") transmission mode and a high speed ("HS") transmission mode.

As MIPI CSI-x standards correspond to a smaller voltage-swing variant of the LVDS standard, they are also known as "subLVDS" standards. Further, MIPI CSI-x standards are usually implemented on different driver circuitry from those used for LVDS standard.

However, in the automotive industry for instance, it would be desirable to have a single driver circuit which is compliant with both LVDS and MIPI CSI-x standards.

SUMMARY OF THE INVENTION

The present invention provides a driver circuit, an integrated circuit, a printed circuit and a data processing circuit, as described in the accompanying claims. Specific embodiments of the invention are set forth in the dependent claims. These and other aspects of the invention will be apparent from an elucidated with reference to the embodiments described hereinafter.

BRIEF DESCRIPTION OF THE DRAWINGS

Further details, aspects and embodiments of the proposed solution will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

It has been found that both LVDS and subLVDS standards can be implemented on a single set of circuitry derived from a conventional LVDS driver circuit architecture.

Figure 1:
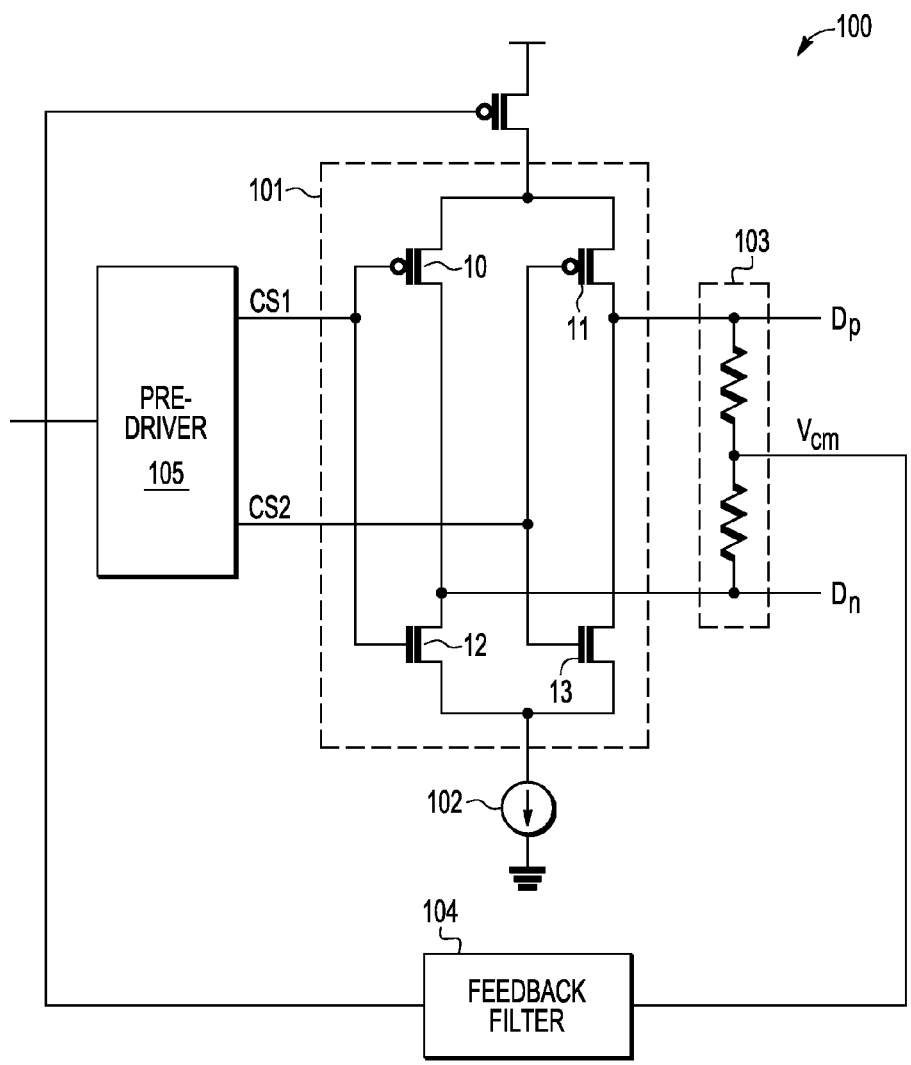
FIG. 1 is a block diagram of a conventional LVDS driver circuit.

FIG. 1 is a block diagram showing a conventional LVDS driver circuit 100 as disclosed in document U.S. Pat. No. 8,466,982 B2. LVDS driver circuit 100 includes a differential switching circuit 101 for a driver (or "output") stage, a current source 102 and a pre-driver 105. The differential switching circuit 101 includes four transistors 10, 11, 12, 13 and two output pads Dp and Dn. The ON/OFF status of the transistors 10 and 12 are controlled by control signal CS1, and that of the transistors 11 and 13 are controlled by control signal CS2. When control signal CS1 is LOW and CS2 is HIGH, transistors 10 and 13 are ON and transistors 11 and 12 are OFF. Thus, a downward current is produced at a receivers resistor (not shown) of the output stage and output logic "1" is produced based on the download current. When control signal CS1 is HIGH and CS2 is LOW, transistors 11 and 12 are ON and transistors 10 and 13 are OFF. Thus, an upward current is produced at the receivers resistor of the output stage and output logic "0" is produced based on the upload current. One should note that in this configuration, half of the transistors are on, and the other half are off at any time as they are used in a switch-mode fashion. The tail current from differential switching circuit 101 is adjusted to control the output voltage swing. The common mode level Vcm is sensed by tapping the mid-point of back termination resistor 103. The Vcm is tracked and adjusted using common mode feedback filter 104 in real time. Such arrangement enables LVDS driver circuit 100, for example, to drive differentially the output pads Dp and Dn with a common mode voltage level of 1.2 V and differential swing of 350 mV.

Figure 2:
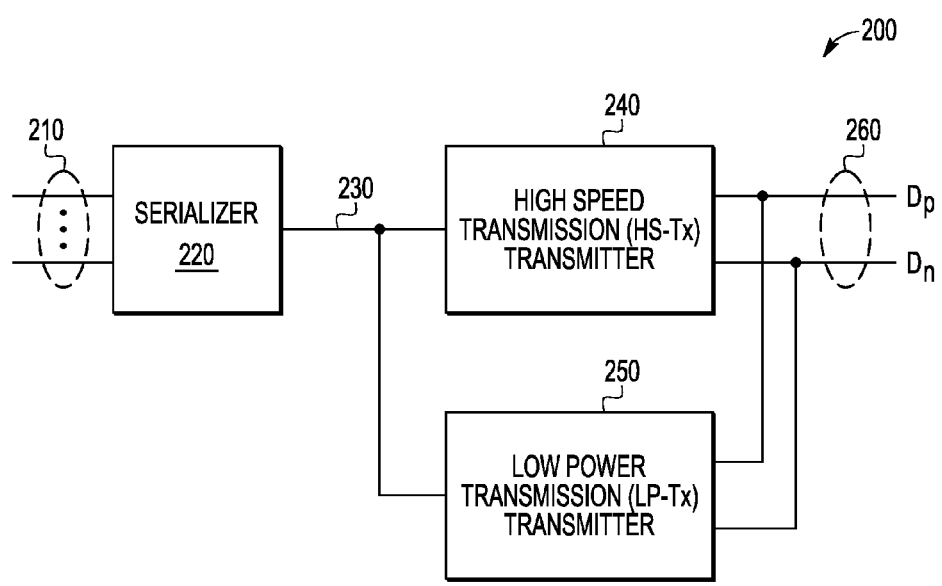
FIG. 2 is a block diagram of conventional MIPI CSI-x driver system.

FIG. 2 is a block diagram of a conventional MIPI CSI-x driver system 200. MIPI CSI-x driver system 200 includes serializer 220, high speed transmission HS-TX transmitter 240 and low power transmission LP-TX transmitter 250. Serializer 220 (also referred to as a multiplexer, or "MUX") converts parallel data—e.g. received on multiple parallel channels 210—into a single data channel 230 having a higher rate of transmission. Pre-driver 105 of FIG. 1 may, for example, include circuitry to implement the functionality of serializer 220.

As shown in FIG. 2, a differential output 260 of MIPI CSI-x driver system 200 includes respective output signals provided on output pads Dp and Dn similar to those used in the conventional LVDS driver circuit 100 of FIG. 1 and which are shared by HS and LP transmissions in order to reduce the number of package pins and cost of packing. However, in comparison with LVDS driver circuit 100, output pads Dp and Dn are driven with different line levels depending on the mode of transmission of the MIPI CSI-x driver system 200. For example, a HS-TX transmitter 240 of MIPI CSI-x driver system 200 drives the lane differentially with a low common mode voltage level of 200 mV and differential swing of 300 mV. By contrast, a LP-TX transmitter 250 of MIPI CSI-x driver system 200 may, at other times, output signals which toggle between 0V and 1.2V.

The MIPI CSI-x standards are considered to be known to those skilled in the art. However, the core of the standards is briefly described below to highlight the differences with LVDS standard as described above. More detailed information can be obtained by referring to the standards directly. A MIPI CSI-x driver system has a high speed (HS) operation where Dp and Dn output pads operate differentially to indicate a "1" or a "0". One should note that LVDS standard behaves in a similar way. A MIPI CSI-x driver system also has a Low Power (LP) operation, where each of Dp and Dn output pads are driven independently. So in LP operation there are four possible states of the Dp and Dn output pads: "11", "10", "01", and "00". One should note that LVDS standard does not provide such capability.

To summarize, one could note from the foregoing FIG. 1 and FIG. 2 that a single set of circuitry which supports both LVDS and subLVDS standards should be able to drive output pads Dp and Dn for three different transmission modes which are the high speed transmission mode of LVDS standard, the high speed transmission mode of subLVDS standard and the low power transmission mode of subLVDS standard.

Figure 3:
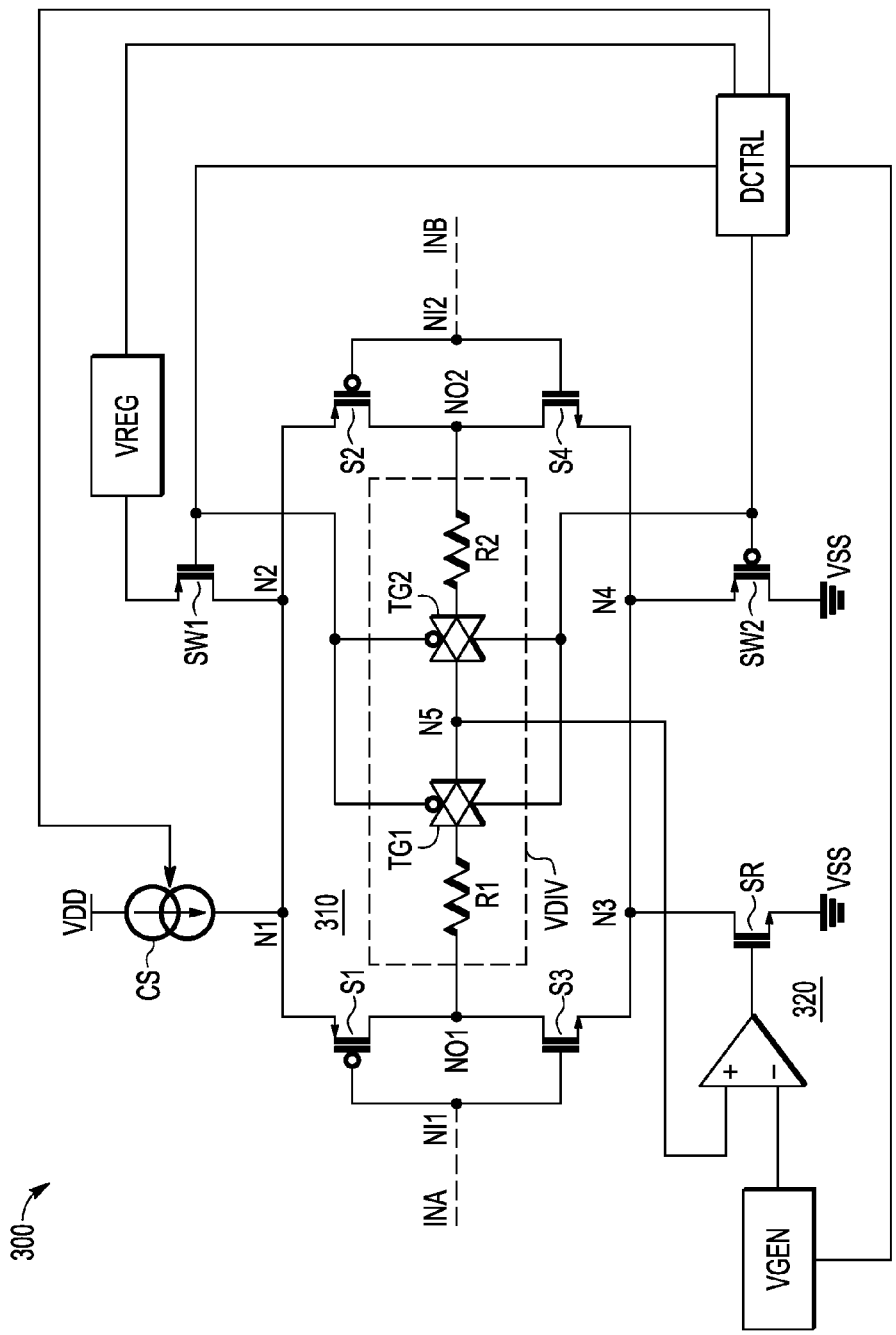
FIG. 3 is a block diagram of a driver circuit according to an embodiment of the subject application.

Referring now to FIG. 3, there is diagrammatically shown therein an exemplary driver circuit 300 in accordance with embodiments of the subject application. In FIG. 3, driver circuit 300 is configured to produce a pair of output signals from a pair of input signals INA and INB. In an example, input signals INA and INB are similar to control signal CS1 and CS2 as already described above with respect to conventional LVDS driver circuit 100 of FIG. 1. Further, in an example, output signals produced by driver circuit 300 are similar to output signals provided on output pads Dp and Dn as already described above with respect to conventional LVDS driver circuit 100 and conventional MIPI CSI-x driver system 200 of FIG. 2.

In FIG. 3, driver circuit 300 comprises a current source CS connected between a first node N1 and a supply terminal VDD. Current source CS is operative to supply a driving current to first node N1.

Further, driver circuit 300 comprises a first switch SW1 connected in parallel with current source CS between a second node N2 and a voltage regulator VREG. In FIG. 3, voltage regulator VREG is operative to supply a DC regulated operating voltage to a terminal of first switch SW1. In the example of FIG. 3, first switch SW1 is a NMOS transistor. However, in another example SW1 could be a PMOS transistor.

Further in FIG. 3, driver circuit 300 includes a differential switching circuit 310 connected between first node N1, second node N2, a third node N3 and a fourth node N4. Differential switching circuit 310 comprises four transistors S1, S2, S3 and S4 which are arranged in a similar manner as transistors 10, 11, 12, 13 of conventional LVDS driver circuit as already explained above.

In one embodiment, differential switching circuit 310 comprises two PMOS transistors and two NMOS transistors. In the example of FIG. 3, transistors S1 and S2 are PMOS transistors while transistors S3 and S4 are NMOS transistors.

Differential switching circuit 310 is operative to receive input signals INA and INB at a first input node NI1 and at a second input node NI2. Input signal INA is configured to drive transistors S1 and S3 while input signal INB is configured to drive transistors S2 and S4 as already explained above with respect to FIG. 1. Differential switching circuit 310 is further operative to convert input signals INA and INB to a pair of output signals at a first output node NO1 and at a second output node NO2.

Furthermore in FIG. 3, driver circuit 300 includes a voltage divider VDIV coupled between first output node NO1 and second output node NO2. Voltage divider VDIV of FIG. 3 also comprises a first transmission gate switch TG1 and a second transmission gate switch TG2 which are serially connected through a fifth node N5 of voltage divider VDIV.

In one embodiment as shown in FIG. 3, voltage divider VDIV further comprises:
  a first resistor R1 coupled between first output node NO1 and first transmission gate switch TG1; and
  a second resistor R2 coupled between second output node NO2 and second transmission gate switch TG2 node.

In an example, first resistor R1 and second resistor R2 have substantially equal resistance. As a result, the voltage at fifth node N5 is at the average level of voltages at first output node NO1 and second output node NO2 when current is flowing between first resistor R1 and second resistor R2.

Still in FIG. 3, a common-mode-feedback circuit 320 is coupled to fifth node N5. Common-mode-feedback circuit 320 is operative to generate a common mode control signal in response to a reference voltage and a level of voltage at fifth node N5.

In the exemplary embodiment of FIG. 3, a voltage generator VGEN is coupled to digital controller DCTRL and is operative to generate the reference voltage in response to a control signal provided by digital controller DCTRL. In one embodiment, the control signal comprises common mode selection information indicative of desired common mode voltage of the driver circuit 300. This enables to select appropriate common mode voltage for high speed transmission mode of LVDS and MIPI CSI-x standards, for instance.

Furthermore in FIG. 3, a common mode resistance unit SR is coupled between third node N3 and a ground terminal VSS where common mode resistance unit SR has a resistance value controlled by common mode control signal. In the example of FIG. 3, common mode resistance unit SR is a NMOS transistor. Common mode resistance unit SR serves as a resistor to adjust the common mode voltage for high speed transmission.

Further, a second switch SW2 is coupled in parallel with common mode resistance unit SR between fourth node N4 and ground terminal VSS. In the example of FIG. 3, second switch SW2 is a PMOS transistor. However, in another example SW1 could be a NMOS transistor.

Finally, a digital controller DCTRL, such as MCU or a processing unit, is coupled to current source CS, voltage regulator VREG, voltage divider VDIV, first switch SW1 and second switch SW2.

In operation, driver circuit 300 is configured to select between a first mode of operation and a second mode of operation.

In the first mode of operation of driver circuit 300, input signals INA and INB and output signals are differential signals and current is conducted from current source CS to ground terminal VSS while passing through fifth node N5 in the driver side. Further in the first mode of operation, a second portion of current source CS is fed through the receivers resistor (not shown) of the output stage to define the LVDS swing level.

In embodiments of the first mode of operation, digital controller DCTRL is operative to set the first transmission gate switch TG1 and second transmission gate switch TG2 in a closed state. This arrangement enables current to flow through fifth node N5. Further, in the first mode of operation, digital controller DCTRL is operative to set first switch SW1 and second switch SW2 in an open state. The foregoing disables switches SW1 and SW2 such that DC voltage produced by voltage regulator VREG is not applied to differential switching circuit 310. Therefore, in the first mode of operation of driver circuit 300, only current supplied by current source CS is applied to differential switching circuit 310. Moreover, one may save current consumption of driver circuit 300 in the first mode by deactivating voltage regulator VREG.

In another embodiment of the first mode of operation, the differential output signals are transmitted using a High Speed (HS) mode of MIPI CSI-x transmission standard or a low voltage differential signaling (LVDS) transmission standard.

In the second mode of operation of driver circuit 300, input signals INA and INB and output signals are single-ended signals and output voltages are generated between voltage regulator VREG and ground terminal VSS. In this mode known as DC mode, no current is flowing through differential switching circuit 310. Therefore, in the second mode of operation, no current is flowing from driver circuit 300 to the receivers resistor (not shown) of the output stage.

In embodiments of the second mode of operation, digital controller DCTRL is operative to set the first transmission gate switch TG1 and second transmission gate switch TG2 in an open state. This arrangement prevents current from flowing through fifth node N5. This has the effect that common-mode-feedback circuit 320 is inoperative since voltage level at fifth node N5 cannot be sensed. Therefore, in the second mode of operation of driver circuit 300, common-mode-feedback circuit 320 and common mode resistance unit SR can be deactivated if needed. Moreover, one may further save current consumption of driver circuit 300 in the second mode by deactivating voltage generator VGEN. Furthermore, in the second mode of operation, digital controller DCTRL is operative to set first switch SW1 and the second switch SW2 in a closed state. The foregoing activates switches SW1 and SW2 such that DC voltage produced by voltage regulator VREG is applied to differential switching circuit 310. In that case, current source CS is deactivated by digital controller DCTRL such that only voltage is supplied to differential switching circuit 310 by voltage regulator VREG.

From another perspective, one should note that in the second mode of operation, driver circuit 300 is divided into two push-pull drive circuits. Namely, a first push-pull drive circuit comprises transistors S1 and S3, while a second push-pull drive circuit comprises transistors S2 and S4. Hence, the effective switching of transistors of each push-pull drive circuit enables controlling output voltages between voltage regulator VREG and ground terminal VSS. It is this mechanism which enables driver circuit 300 producing, for instance, output signals which toggle between 0V and 1.2V for Low Power (LP) mode of MIPI CSI-x transmission standard.

In another embodiment of the second mode of operation, the differential output signals are transmitted using a Low Power (LP) mode of MIPI CSI-x transmission standard.

One would note that the proposed solution brings improvements over conventional LVDS and subLVDS driver circuits. Proposed solution enables the use of a single driver circuit (also known as "buffer") which is compliant with both LVDS and subLVDS transmission standards. This allows flexibility with MCUs for instance the automotive industry. Further, proposed solution has the advantage of saving die size in comparison to a solution where two buffers would have been used for different transmission standards. Further, high speed transmission rate is maintained since transmission is performed for one standard at the time.

Of course, the above advantages are exemplary, and these or other advantages may be achieved by the proposed solution. Further, the skilled person will appreciate that not all advantages stated above are necessarily achieved by embodiments described herein.

The proposed driver circuit 300 may also be implemented in an integrated circuit, a printed circuit board comprising the integrated circuit and data processing system comprising the printed circuit board.

In the foregoing specification, the proposed solution has been described with reference to specific examples of embodiments of the proposed solution. It will, however, be evident that various modifications and changes may be made therein without departing from the broader scope of the proposed solution as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of devices to achieve the same functionality is effectively "associated" such that the desired functionality is achieved. Hence, any two devices herein combined to achieve a particular functionality may be seen as "associated with" each other such that the desired functionality is achieved, irrespective of architectures or intermediate devices. Likewise, any two devices so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple examples of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or operations then those listed in a claim. Furthermore, the terms "a" or "an," as used herein, are defined as one or as more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A driver circuit configured to produce a pair of output signals from a pair of input signals, the driver circuit comprising:
   a current source connected between a first node and a supply terminal, and operative to supply a driving current to the first node;
   a first switch connected in parallel with the current source between a second node and a voltage regulator operative to supply a DC regulated operating voltage to a terminal of the first switch;
   a differential switching circuit connected between the first node, the second node, a third node and a fourth node, and operative to receive the pair of input signals at a first input node and at a second input node, and convert the pair of input signals to the pair of output signals at a first output node and at a second output node;
   a voltage divider coupled between the first output node and the second output node, having a first transmission gate switch and a second transmission gate switch serially connected through a fifth node of the voltage divider;
   a common-mode-feedback circuit coupled to the fifth node, and operative to generate a common mode control signal in response to a reference voltage and a level of voltage at the fifth node;
   a common mode resistance unit coupled between the third node and a ground terminal, and having a resistance value controlled by the common mode control signal;
   a second switch coupled in parallel with the common mode resistance unit between the fourth node and the ground terminal;
   a digital controller coupled to the current source, the voltage regulator, the voltage divider, the first switch and the second switch;
   wherein the driver circuit is operative to select between:
   a) a first mode of operation in which input signals and output signals are differential signals and in which current is conducted from the current source to the ground terminal, passing through the fifth node, and
   b) a second mode of operation in which input signals and output signals are single-ended signals and in which output voltages are generated between the voltage regulator and the ground terminal.

2. The driver circuit of claim 1 wherein:
   in the first mode of operation, the digital controller is operative to:
      set the first transmission gate switch and the second transmission gate switch in a closed state, and
      set the first switch and the second switch in an open state;
   in the second mode of operation, the digital controller is operative to:
      set the first transmission gate switch and the second transmission gate switch in an open state, and
      set the first switch and the second switch in a closed state.

3. The driver circuit of claim 1 wherein the voltage divider further comprises:
   a first resistor coupled between the first output node and the first transmission gate switch; and
   a second resistor coupled between second output node and the second transmission gate switch.

4. The driver circuit of claim 3 wherein:
   the first resistor and the second resistor have substantially equal resistance.

5. The driver circuit of claim 1, wherein:
   the differential switching circuit comprises two PMOS transistors and two NMOS transistors.

6. The driver circuit of claim 1 wherein:
   the first switch and the second switch are MOS transistors.

7. The driver circuit of claim 1 wherein:
   the common mode resistance unit is a NMOS transistor.

8. The driver circuit of claim 1 further comprising, in the first mode:
   a voltage generator coupled to the digital controller and operative to generate the reference voltage in response to a control signal provided by the digital controller.

9. An integrated circuit comprising the driver circuit of claim 1.

10. A printed circuit board comprising the integrated circuit of claim 9.

11. A data processing system comprising the printed circuit board of claim 10.

12. A driver circuit configured to produce a pair of output signals from a pair of input signals, the driver circuit comprising:
   a current source connected between a first node and a supply terminal, and operative to supply a driving current to the first node;
   a first switch connected in parallel with the current source between a second node and a voltage regulator operative to supply a DC regulated operating voltage to a terminal of the first switch;
   a differential switching circuit connected between the first node, the second node, a third node and a fourth node, and operative to receive the pair of input signals at a first input node and at a second input node, and convert the pair of input signals to the pair of output signals at a first output node and at a second output node;
   a voltage divider coupled between the first output node and the second output node, having a first transmission gate switch and a second transmission gate switch serially connected through a fifth node of the voltage divider;
   a common-mode-feedback circuit coupled to the fifth node, and operative to generate a common mode control signal in response to a reference voltage and a level of voltage at the fifth node;
   a common mode resistance unit coupled between the third node and a ground terminal, and having a resistance value controlled by the common mode control signal;
   a second switch coupled in parallel with the common mode resistance unit between the fourth node and the ground terminal;
   a digital controller coupled to the current source, the voltage regulator, the voltage divider, the first switch and the second switch;
   wherein the driver circuit is operative to select between:
   a) a first mode of operation, in which the differential output signals are transmitted using a High Speed mode of MIPI CSI-x transmission standard or a low voltage differential signaling transmission standard, and b) a second mode of operation, in which the differential output signals are transmitted using a Low Power mode of MIPI CSI-x transmission standard.

13. The driver circuit of claim 12 further comprising:
a voltage generator coupled to the digital controller and operative to generate the reference voltage in response to a control signal provided by the digital controller.

14. The driver circuit of claim 13 wherein, in the first mode of operation, the control signal comprises common mode selection information indicative of desired common mode voltage of the driver circuit.

15. The driver circuit of claim 13 wherein:
in the first mode of operation, the digital controller is operative to:
set the first transmission gate switch and the second transmission gate switch in a closed state, and
set the first switch and the second switch in an open state;
in the second mode of operation, the digital controller is operative to:
set the first transmission gate switch and the second transmission gate switch in an open state, and
set the first switch and the second switch in a closed state.

16. The driver circuit of claim 13 wherein the differential switching circuit comprises:
a first resistor coupled between the first output node and the first transmission gate switch; and
a second resistor coupled between the second transmission gate switch and the second output node.

17. The driver circuit of claim 16 wherein:
the first resistor and the second resistor have substantially equal resistance.

18. The driver circuit of claim 13, further comprising, in the first mode:
a voltage generator coupled to the digital controller and operative to generate the reference voltage in response to a control signal provided by the digital controller.

19. An integrated circuit comprising the driver circuit of claim 13.

20. A printed circuit board comprising the integrated circuit of claim 19.

* * * * *